United States Patent
Chen et al.

(10) Patent No.: US 10,585,335 B1
(45) Date of Patent: Mar. 10, 2020

(54) CAMERA MODULE

(71) Applicant: TRIPLE WIN TECHNOLOGY (SHENZHEN) CO. LTD., Shenzhen (CN)

(72) Inventors: Shin-Wen Chen, New Taipei (TW); Jian-Chao Song, Guangdong (CN); Jing-Wei Li, Guangdong (CN); Sheng-Jie Ding, Guangdong (CN)

(73) Assignee: TRIPLE WIN TECHNOLOGY (SHENZHEN) CO. LTD., Shenzhen (CN)

( * ) Notice: Subject to any disclaimer, the term of this patent is extended or adjusted under 35 U.S.C. 154(b) by 0 days.

(21) Appl. No.: 16/201,968

(22) Filed: Nov. 27, 2018

(30) Foreign Application Priority Data

Sep. 13, 2018 (CN) .......................... 2018 1 1069806

(51) Int. Cl.
*G03B 17/00* (2006.01)
*G03B 17/55* (2006.01)
*H05K 7/20* (2006.01)
*G03B 17/12* (2006.01)
*H05K 1/18* (2006.01)

(52) U.S. Cl.
CPC .............. *G03B 17/55* (2013.01); *G03B 17/12* (2013.01); *H05K 7/20445* (2013.01); *H05K 1/181* (2013.01); *H05K 2201/10121* (2013.01); *H05K 2201/10151* (2013.01)

(58) Field of Classification Search
CPC .......... G03B 17/55; G03B 17/00; H05K 7/20
USPC .................. 396/542, 529; 348/342; 359/819
See application file for complete search history.

(56) References Cited

U.S. PATENT DOCUMENTS

2008/0192435 A1*  8/2008  Yamamiya ........ H01L 27/14618
                                            361/703
2018/0337302 A1* 11/2018  Lee ..................... H01L 31/1136

* cited by examiner

*Primary Examiner* — Clayton E. LaBalle
*Assistant Examiner* — Fang-Chi Chang
(74) *Attorney, Agent, or Firm* — ScienBiziP, P.C.

(57) ABSTRACT

A camera module with good heat dissipation efficiency and stability includes a base. The base comprises a first receiving groove. At least one escaping hole is defined at the base and the escaping hole forms a connection between the first receiving groove and the ambient environment. At least one heat dissipation block is received in each escaping hole.

17 Claims, 5 Drawing Sheets

CAMERA MODULE

FIELD

The subject matter generally relates to a camera module.

BACKGROUND

Most camera modules on the market are composed of a lens, a holder, a motor, a filter, a sensor chip, a plastic base, and a circuit board. Cameras are used more frequently and cameras with good reliability and quality are expected.

The holder, the lens, and the printed circuit board are made of plastic materials. An enclosed space is defined by the holder, the lens, and the printed circuit board to avoid dusts or debris entering into the interior of the optical projection device of the camera. Such arrangements may hinder heat dissipation from the camera module and cause heating of the camera module which will affect the precision and quality of the structures guiding light in the camera module.

Therefore, there is room for improvement in the art.

BRIEF DESCRIPTION OF THE DRAWINGS

Implementations of the present technology will now be described, by way of embodiments only, with reference to the attached figures.

DETAILED DESCRIPTION

Figure 1:
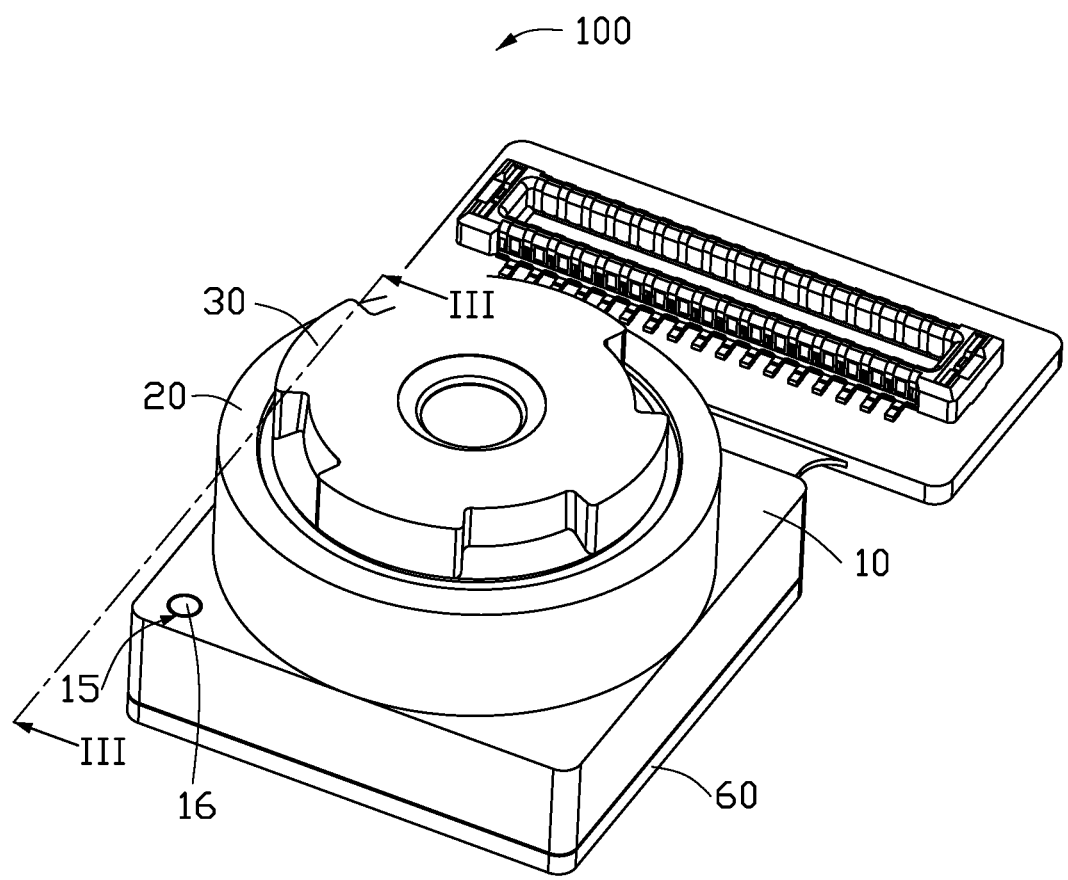
FIG. 1 is a view of a first embodiment of a camera module of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain portions may be exaggerated to better illustrate details and features of the present disclosure.

The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

The term "comprising," when utilized, means "including, but not necessarily limited to"; it specifically indicates open-ended inclusion or membership in the so-described combination, group, series, and the like.

Figure 2:
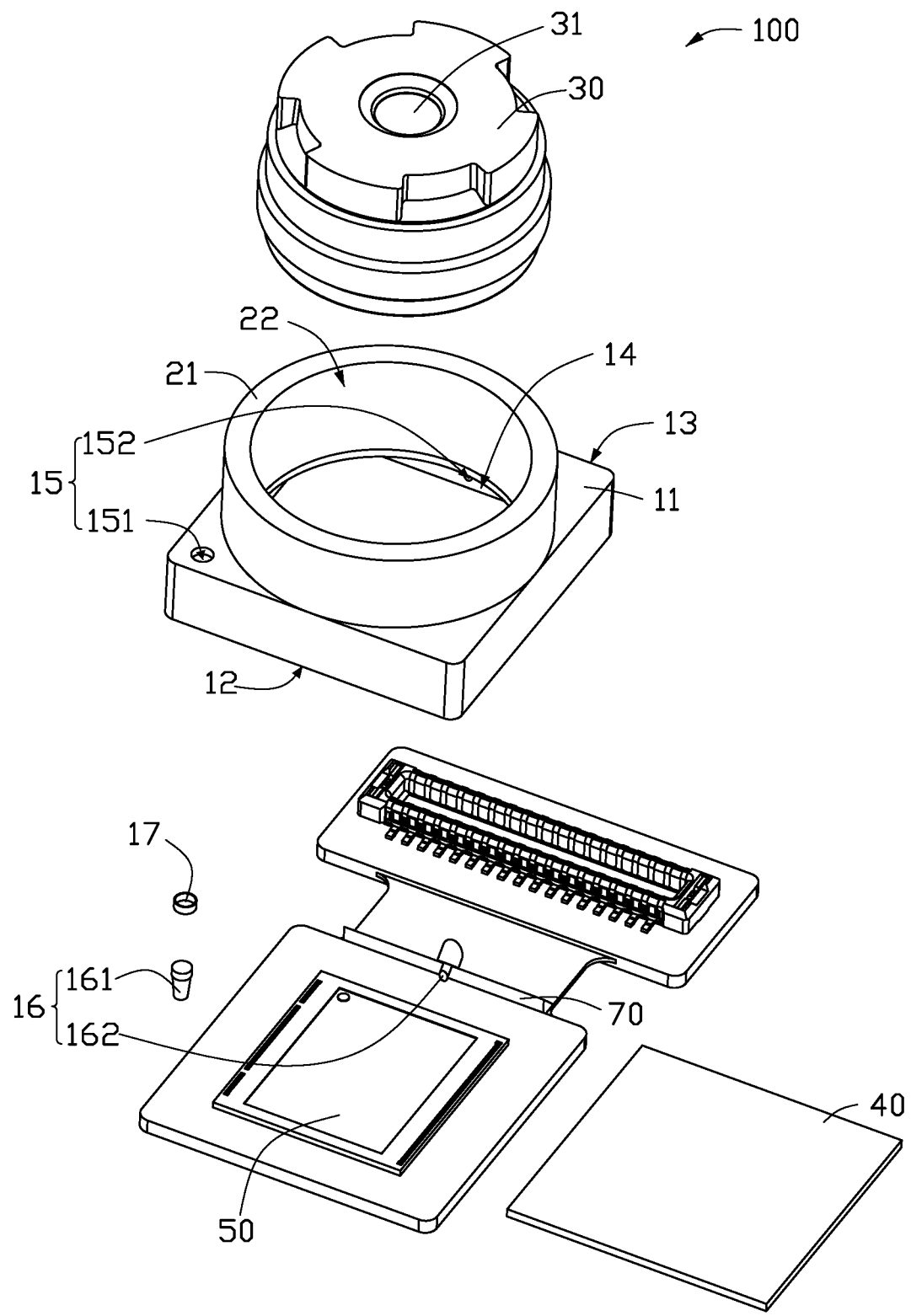
FIG. 2 is an exploded view of the camera module of FIG. 1.
Figure 3:
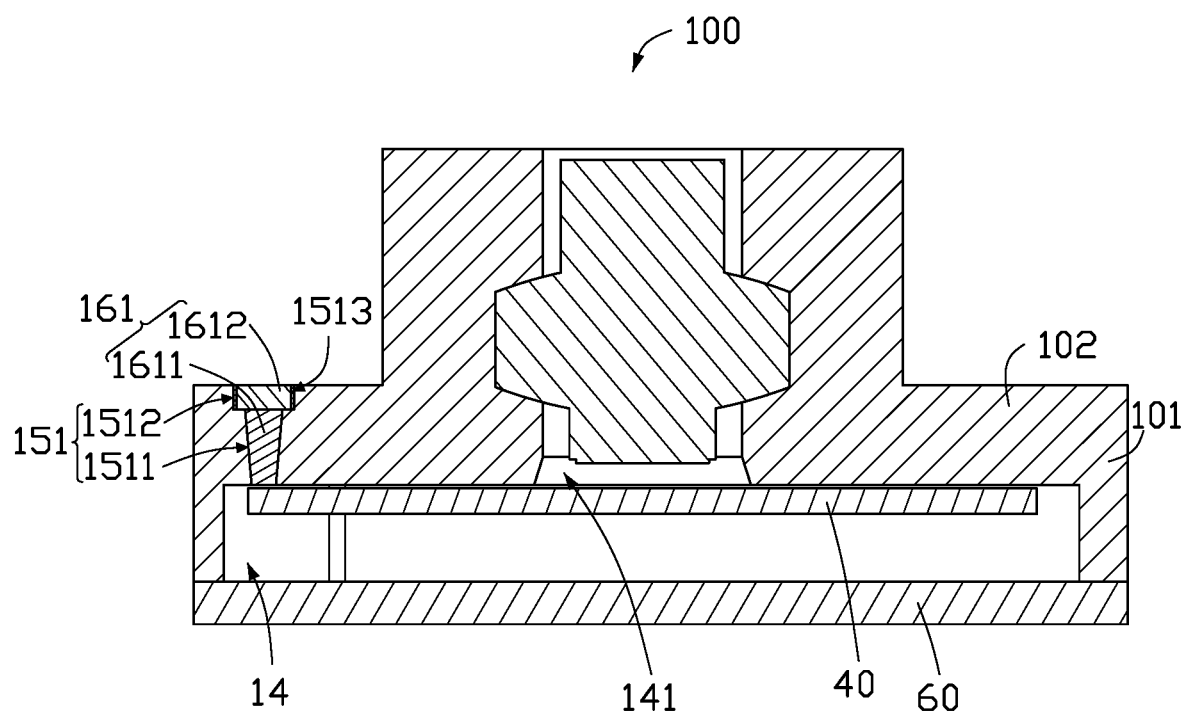
FIG. 3 is a cross-sectional view of the camera module along line of FIG. 1.
Figure 4:
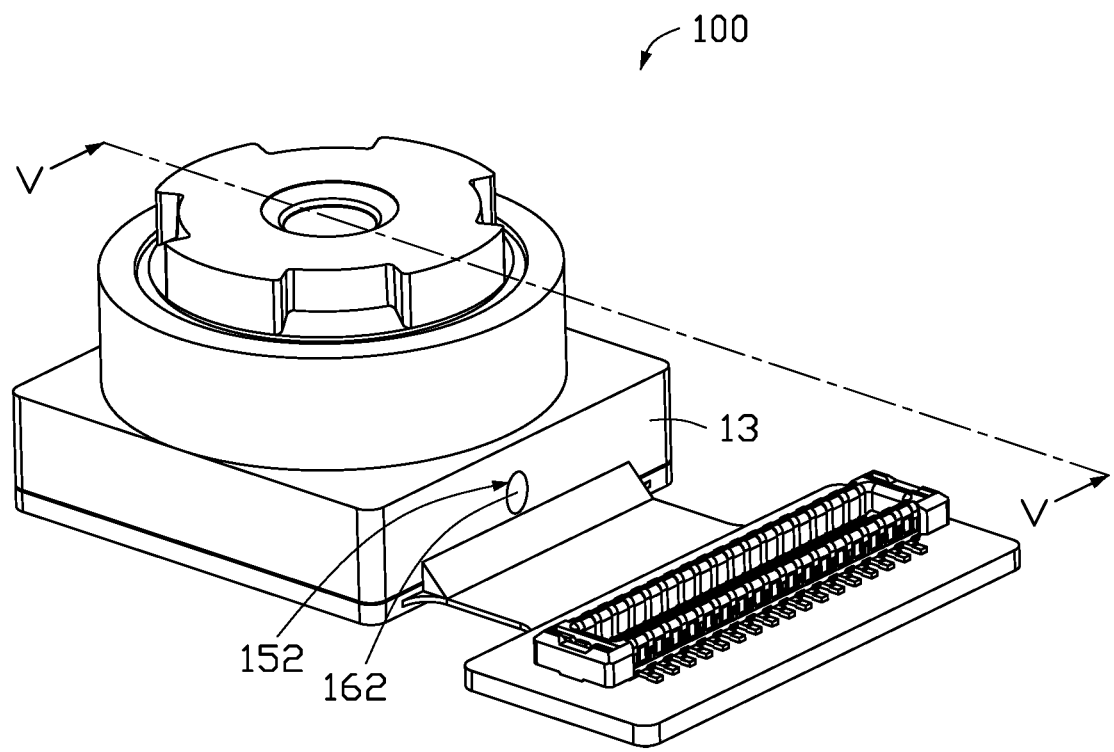
FIG. 4 is similar to FIG. 1, but showing the camera module from another angle.
Figure 5:
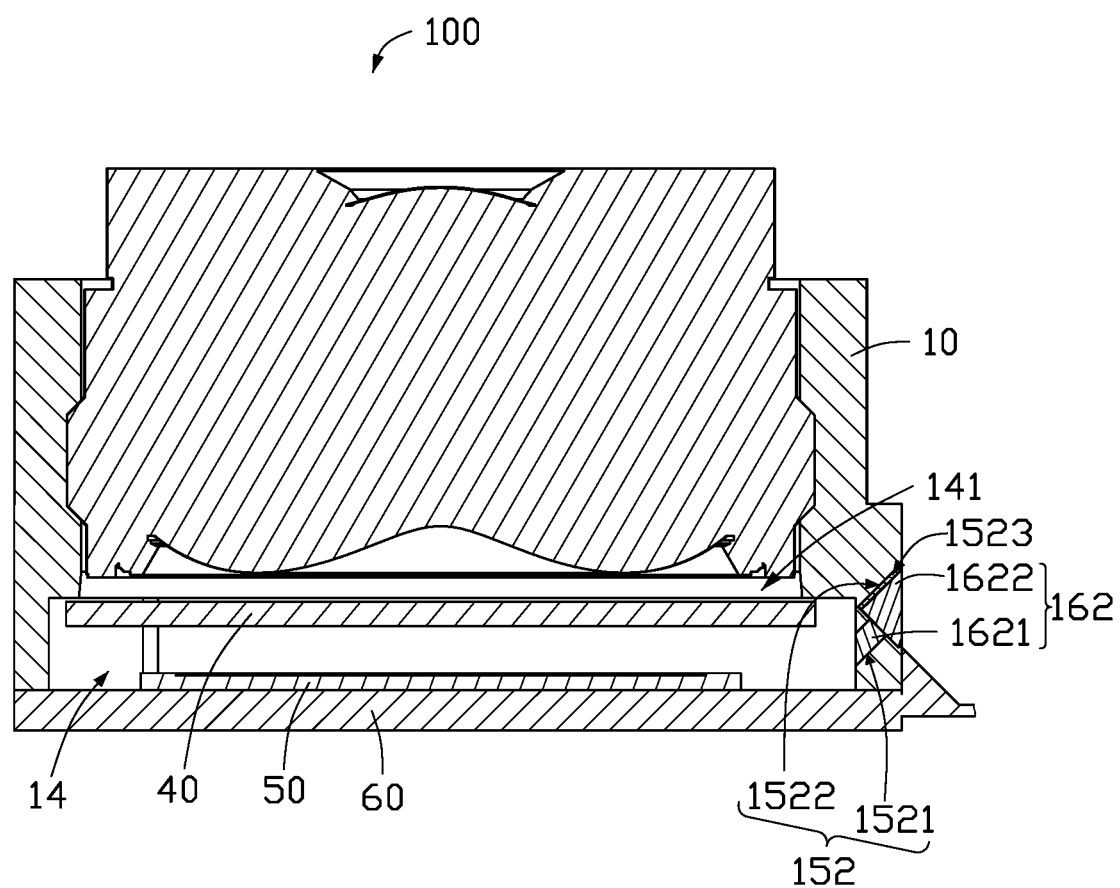
FIG. 5 is a cross-sectional view of the camera module along line V-V of FIG. 4.

FIGS. 1-5 illustrate an embodiment of a camera module 100. The camera module 100 includes a base 10, a lens cone 20, a lens 30, an optical filter 40, a sensor 50, and a printed circuit board 60. The lens 30 is received in the lens cone 20. The lens cone 20 is fixed on the base 10. The base 10 is fixed on the printed circuit board 60. The optical filter 40 is received in the base 10. The sensor 50 is received in the base 10 and formed on the printed circuit board 60.

The base 10 includes a first surface 11, a second surface 12 opposite to the first surface 11, and a plurality of side surfaces 13 each perpendicularly connected to the first surface 11 and the second surface 12.

The base 10 includes a plurality of sidewalls 101 and a bottom wall 102 connected to each of the sidewalls 101. The bottom wall 102 and the plurality of sidewalls 101 define a first receiving groove 14.

The first receiving groove 14 receives the optical filter 40 and the sensor 50. The first receiving groove 14 runs through the second surface 12.

An opening 141 is defined in the bottom wall 102, the opening 141 runs through the bottom wall 102.

At least one escaping hole 15 is defined at the sidewalls 101 or in the bottom wall 102. The escaping hole 15 connects the first receiving groove 14 and the ambient environment. A heat dissipation block 16 is received in each of the at least one escaping hole 15. The heat dissipation block 16 can be fixed in the escaping hole 15 by adhesive 17. The heat dissipation block 16 can be made of metal or other materials having good heat dissipation efficiency.

In an embodiment, the at least one escaping hole 15 includes a first escaping hole 151, a second escaping hole 152, and a combination thereof. The heat dissipation block 16 includes a first heat dissipation block 161, a second heat dissipation block 162, and a combination thereof. The first heat dissipation block 161 is received in the first escaping hole 151. The second heat dissipation block 162 is received in the second escaping hole 152.

The first escaping hole 151 is defined at the bottom wall 102 along a direction that is perpendicular to the printed circuit board 60. The first escaping hole 151 run through the first surface 11 and the second surface 12. The first escaping hole 151 is connected to the first receiving groove 14.

The first escaping hole 151 includes a first hole portion 1511 and a second hole portion 1512 connected to the first hole portion 1511. The first hole portion 1511 is positioned adjacent to the first receiving groove 14. The second hole portion 1512 is positioned adjacent to the first surface 11. A width of the second hole portion 1512 is greater than a width of the first hole portion 1511, the width being larger to increase heat dissipation area of the first heat dissipation block 161. The first heat dissipation block 161 includes a first heat dissipation portion 1611 and a second heat dissipation portion 1612 connected to the first heat dissipation portion 1611. The first heat dissipation portion 1611 is received in the first hole portion 1511. The second heat dissipation portion 1612 is received in the second hole portion 1512. A width of the second heat dissipation portion 1612 is greater than a width of the first heat dissipation portion 1611. A width of the second hole portion 1512 is greater than a width of the second heat dissipation portion 1612, a first gap 1513 is defined between the second hole portion 1512 and the second heat dissipation portion 1612. The first gap receives the adhesive 17.

The second escaping hole 152 is defined at the sidewall 101 along a direction that is inclined with respect to the sidewall 101, the inclination allows the second heat dissipation block 162 received therein to have a larger heat dissipation area. The second escaping hole 152 run through the sidewall 101 and is connected to the first receiving groove 14.

The second escaping hole 152 includes a third hole portion 1521 and a fourth hole portion 1522 connected to the third hole portion 1521. The third hole portion 1521 is positioned adjacent to the first receiving groove 14. The fourth hole portion 1522 is positioned adjacent to at least one of the side surfaces 13. A width of the fourth hole portion 1522 is greater than a width of the third hole portion 1521, to increase heat dissipation area of the second heat dissipation block 162. The second heat dissipation block 162 includes a third heat dissipation portion 1621 and a fourth heat dissipation portion 1622 connected to the third heat dissipation portion 1621. The third heat dissipation portion 1621 is received in the third hole portion 1521. The fourth heat dissipation portion 1622 is received in the fourth hole portion 1522. A width of the fourth heat dissipation portion 1622 is greater than a width of the third heat dissipation portion 1621. A width of the fourth hole portion 1522 is greater than a width of the fourth heat dissipation portion 1622, a second gap 1523 is defined between the fourth hole portion 1522 and the fourth heat dissipation portion 1622. The second gap receives the adhesive 17.

The lens cone 20 is fixed on the base 10. In an embodiment, the lens cone 20 and the base 10 are integrally formed. In another embodiment, the lens cone 20 can be connected to the base 10 by screws or adhesive.

The lens cone 20 includes a third surface 21, a second receiving groove 22 configured for the lens cone 20. The second receiving groove 22 runs through the third surface 21. The second receiving groove 22 receives and fixes the lens 30. The second receiving groove 22 is connected to the first receiving groove 14.

The lens 30 is received and fixed in the second receiving groove 22. The lens 30 includes an ophthalmic lens 31 facing the opening 141.

The optical filter 40 filters out stray light entering into the camera module 100. The optical filter 40 is fixed on the bottom wall 102 and received in the first receiving groove 14. A portion of the optical filter 40 is exposed from the opening 141.

The sensor 50 is fixed on and electrically connected to the printed circuit board 60. The sensor 50 is received in the first receiving groove 14 and faces the optical filter 40.

The camera module 100 further includes a stiffening adhesive 70. The stiffening adhesive 70 is formed on the first side surface 13 of the base 10 and the printed circuit board 60, to enhance structural strength of the camera module 100.

The camera module 100 further includes a voice coil motor. The voice coil motor surrounds the lens cone 20 and is electrically connected to the lens 30. The voice coil motor can move the lens 30 up and down for focusing.

The camera module as disclosed, the escaping hole 15 is defined at the sidewalls 101 or in the bottom wall 102. The heat dissipation block 16 is received in each of the at least one escaping hole 15. Heat can be dissipated from the camera module 100 quickly to have good heat dissipation efficiency, the heat generated by the sensor 50 or other electronic components can be dissipated to the ambient environment, further improving the quality of the images of the camera module 100. Furthermore, the heat dissipation block 16 can improve the stability of the camera module 100.

The embodiments shown and described above are only examples. Many details are often found in the art such as the other features of a camera module. Therefore, many such details are neither shown nor described. Even though numerous characteristics and advantages of the present technology have been set forth in the foregoing description, together with details of the structure and function of the present disclosure, the disclosure is illustrative only, and changes can be made in the detail, including in matters of shape, size, and arrangement of the parts within the principles of the present disclosure, up to and including the full extent established by the broad general meaning of the terms used in the claims. It will therefore be appreciated that the embodiments described above can be modified within the scope of the claims.

What is claimed is:

1. A camera module comprising:
a base, wherein the base comprises a first receiving groove, a plurality of sidewalls, and a bottom wall connected to each of the sidewalls, the first receiving groove is defined by the bottom wall and the plurality of sidewalls;
at least one escaping hole, wherein the at least one escaping hole is defined at the base and connects to the first receiving groove and ambient environment, the at least one escaping hole comprises a first escaping hole, the first escaping hole is defined in the bottom wall; and
at least one heat dissipation block, wherein the heat dissipation block is received in each of the at least one escaping hole, each of the at least one heat dissipation block comprises a first heat dissipation block, the first heat dissipation block is received in the first escaping hole.

2. The camera module of claim 1, wherein the heat dissipation block is made of metal or other materials having good heat dissipation efficiency.

3. The camera module of claim 1, wherein each of the at least one heat dissipation block is fixed in each of the at least one escaping hole by adhesive.

4. The camera module of claim 1, wherein the camera module further comprises a printed circuit board, the base is formed on the printed circuit board; the first escaping hole is defined at the bottom wall along a direction perpendicular to the printed circuit board.

5. The camera module of claim 1, wherein each of the at least one first escaping hole comprises a first hole portion and a second hole portion connecting to the first hole portion; the first hole portion is positioned adjacent to the first receiving groove.

6. The camera module of claim 5, wherein a width of the second hole portion is greater than a width of the first hole portion.

7. The camera module of claim 5, wherein the first heat dissipation block comprises a first heat dissipation portion and a second heat dissipation portion connecting to the first heat dissipation portion, the first heat dissipation portion is received in the first hole portion, the second heat dissipation portion is received in the second hole portion.

8. The camera module of claim 7, wherein a width of the second heat dissipation portion is greater than a width of the first heat dissipation portion.

9. The camera module of claim 7, wherein a width of the second hole portion is greater than a width of the second heat dissipation portion, a first gap is defined between the second hole portion and the second heat dissipation portion, the first gap receives the adhesive.

10. The camera module of claim 1, wherein the camera module further comprises a lens cone formed on the base and a lens received in the lens cone.

11. The camera module of claim 1, wherein the camera module further comprises an optical filter, the optical filter is fixed on the bottom wall and received in the first receiving groove.

12. The camera module of claim 11, wherein an opening is defined at the bottom wall, a portion of the optical filter is exposed from the opening.

13. A camera module comprising:

a base, wherein the base comprises a first receiving groove, a plurality of sidewalls, and a bottom wall connected to each of the sidewalls, the first receiving groove is defined by the bottom wall and the plurality of sidewalls;

at least one escaping hole, wherein the at least one escaping hole is defined at the base and connects to the first receiving groove and ambient environment, the at least one escaping hole comprises a second escaping hole, the second escaping hole is defined at the sidewall along a direction inclined with respect to the sidewall; and at least one heat dissipation block, wherein the heat dissipation block is received in each of the at least one escaping hole, each of the at least one heat dissipation block comprises a second heat dissipation block, the second heat dissipation block is received in the second escaping hole.

14. The camera module of claim 13, wherein the second escaping hole comprises a third hole portion and a fourth hole portion connecting to the third hole portion, the third hole portion is positioned adjacent to the first receiving groove; the second heat dissipation block comprises a third heat dissipation portion and a fourth heat dissipation portion connecting to the third heat dissipation portion, the third heat dissipation portion is received in the third hole portion, the fourth heat dissipation portion is received in the fourth hole portion.

15. The camera module of claim 14, wherein a width of the fourth hole portion is greater than a width of the fourth heat dissipation portion, a second gap is defined between the fourth hole portion and the fourth heat dissipation portion, the second gap receives the adhesive.

16. The camera module of claim 14, wherein a width of the fourth hole portion is greater than a width of the third hole portion.

17. The camera module of claim 14, wherein a width of the fourth heat dissipation portion is greater than a width of the third heat dissipation portion.

* * * * *